United States Patent
Qi (10) Patent No.: US 11,183,552 B2
(45) Date of Patent: Nov. 23, 2021

(54) DISPLAY PANEL, METHOD FOR MANUFACTURING THE SAME, AND DISPLAY DEVICE

(71) Applicants: Chengdu BOE Optoelectronics Technology Co., Ltd., Chengdu (CN); BOE Technology Group Co., Ltd., Beijing (CN)

(72) Inventor: Puyu Qi, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/812,828

(22) Filed: Mar. 9, 2020

(65) Prior Publication Data
US 2021/0028260 A1 Jan. 28, 2021

(30) Foreign Application Priority Data
Jul. 26, 2019 (CN) ............ 201910683046.0

(51) Int. Cl.
*H01L 27/32* (2006.01)
*H01L 51/52* (2006.01)
*H01L 51/56* (2006.01)

(52) U.S. Cl.
CPC ........ *H01L 27/3272* (2013.01); *H01L 27/322* (2013.01); *H01L 27/3246* (2013.01); *H01L 51/5253* (2013.01); *H01L 51/56* (2013.01); *H01L 2227/323* (2013.01)

(58) Field of Classification Search
CPC ............... H01L 27/3272; H01L 27/322; H01L 27/3246; H01L 27/323; H01L 27/3232; H01L 51/5253; H01L 51/56; H01L 51/5284; H01L 51/5203; H01L 51/5237; H01L 51/5262; H01L 2227/323
USPC ..... 257/40, 43, 72, 84, 88, 89, 98, E21.002, 257/E27.118, E51.018, E51.019; 438/27, 438/23, 29, 151, 155, 158
See application file for complete search history.

(56) References Cited

U.S. PATENT DOCUMENTS

| | | | |
|---|---|---|---|
| 2018/0095567 A1* | 4/2018 | Lee | ............ G06F 3/03547 |
| 2018/0314372 A1* | 11/2018 | Lee | ............ G06F 3/0412 |
| 2019/0121479 A1* | 4/2019 | Lee | ............ G06F 3/04164 |
| 2020/0026385 A1* | 1/2020 | Lee | ............ G06F 3/0416 |

* cited by examiner

*Primary Examiner* — Dao H Nguyen
(74) *Attorney, Agent, or Firm* — Westman, Champlin & Koehler, P.A.

(57) ABSTRACT

Embodiments of the present disclosure provide a display panel, a method for manufacturing a display panel, and a display device. The display panel includes: a display substrate; an encapsulation layer covering the display substrate; a plurality of first electrodes on the encapsulation layer; a black matrix disposed on the encapsulation layer and covering the plurality of first electrodes; a plurality of color resist units disposed on the encapsulation layer and located in opening areas of the black matrix; and a plurality of second electrodes on the black matrix.

16 Claims, 5 Drawing Sheets

DISPLAY PANEL, METHOD FOR MANUFACTURING THE SAME, AND DISPLAY DEVICE

CROSS-REFERENCE TO RELATED APPLICATION

This application claims priority of Chinese Patent Application No. 2019/10683046.0 filed on Jul. 26, 2019 in China National Intellectual Property Administration, the disclosure of which is incorporated herein by reference in entirety.

TECHNICAL FIELD

Embodiments of the present disclosure relate to the field of display technology, and in particular, to a display panel, a method for manufacturing a display panel, and a display device.

BACKGROUND

With the continuous development of display technology, OLED (Organic Light Emitting Diode) display panels have attracted widespread attention due to their advantages such as low energy consumption, low production costs, self-emission, wide viewing angle and fast response speed.

In order to reduce the reflectivity of the display panel, it is usually necessary to attach a circular polarizer to an encapsulation layer of the display panel. The circular polarizer includes a quarter wave plate and a linear polarizer. By means of the circular polarizer, the external light incident into the display panel cannot be reflected out from the display panel, thereby reducing the reflectivity.

SUMMARY

According to an embodiment of the present disclosure, there is provided a display panel, comprising:

a display substrate;

an encapsulation layer covering the display substrate;

a plurality of first electrodes on the encapsulation layer;

a black matrix disposed on the encapsulation layer and covering the plurality of first electrodes;

a plurality of color resist units disposed on the encapsulation layer and located in opening areas of the black matrix; and a plurality of second electrodes on the black matrix.

According to some embodiments of the present disclosure, each of the color resist units comprises a plurality of color resist structures, the display substrate comprises a plurality of pixel units, and each of the pixel units comprises sub-pixels in one-to-one correspondence with the color resist structures.

According to some embodiments of the present disclosure, one or more of the color resist structures in each of the color resist units partially cover the second electrodes.

According to some embodiments of the present disclosure, orthographic projections of two adjacent color resist structures in each of the color resist units on the encapsulation layer have an overlapping area;

wherein the color resist structures cover the second electrodes at the overlapping area, and the color resist structures do not cover pixel opening areas of the sub-pixels in the display substrate at the overlapping area.

According to some embodiments of the present disclosure, a color of light allowed to be transmitted through by one color resist structure is same as a color of light emitted by the sub-pixel corresponding to the color resist structure.

According to some embodiments of the present disclosure, each of the color resist units partially covers the black matrix.

According to some embodiments of the present disclosure, the first electrodes are disposed in a first direction, the second electrodes are disposed in a second direction, and the first direction crosses with the second direction with a preset included angle.

According to some embodiments of the present disclosure, a line width of the first electrodes is less than 30 μm, and a line width of the second electrodes is less than 8 μm.

According to some embodiments of the present disclosure, the first electrodes and the second electrodes are made from Ag.

According to some embodiments of the present disclosure, the display panel further comprises a planarization layer covering the black matrix, the color resist units, and the second electrodes.

According to some embodiments of the present disclosure, one type of the plurality of first electrodes and the plurality of second electrodes functions as driving electrodes, and the other type of the plurality of first electrodes and the plurality of second electrodes functions as sensing electrodes.

According to some embodiments of the present disclosure, the display substrate comprises a base substrate, a pixel defining layer on the base substrate, and an organic light emitting layer in opening areas of the pixel defining layer.

According to some embodiments of the present disclosure, an orthographic projection of the organic light emitting layer in the display substrate on the base substrate is located within an orthographic projection of the color resist units on the base substrate, and the orthographic projection of the organic light emitting layer in the display substrate on the base substrate does not overlap with an orthographic projection of the black matrix on the base substrate.

According to an embodiment of the present disclosure, there is provided a method for manufacturing a display panel, comprising:

providing a display substrate;

forming an encapsulation layer on the display substrate, the encapsulation layer covering the display substrate;

forming a plurality of first electrodes on the encapsulation layer;

forming a black matrix on the encapsulation layer, the black matrix covering the plurality of first electrodes; and forming a plurality of color resist units on the encapsulation layer and forming a plurality of second electrodes on the black matrix, the plurality of color resist units being located in open areas of the black matrix.

According to some embodiments of the present disclosure, forming a plurality of color resist units on the encapsulation layer and forming a plurality of second electrodes on the black matrix comprises:

forming the plurality of color resist units on the encapsulation layer; and forming the plurality of second electrodes on the black matrix.

According to some embodiments of the present disclosure, forming a plurality of color resist units on the encapsulation layer and forming a plurality of second electrodes on the black matrix comprises:

forming the plurality of second electrodes on the black matrix; and forming the plurality of color resist units on the encapsulation layer.

According to some embodiments of the present disclosure, the color resist units partially cover the second electrodes.

According to some embodiments of the present disclosure, after forming a plurality of color resist units on the encapsulation layer and forming a plurality of second electrodes on the black matrix, the method further comprises:

forming a planarization layer, the planarization layer covering the black matrix, the color resist units, and the second electrodes.

According to an embodiment of the present disclosure, there is provided a display device, comprising the display panel according to any one of the above embodiments.

DETAILED DESCRIPTION OF EMBODIMENTS

In order to make the above objectives, features, and advantages of the present disclosure more understandable, the present disclosure will be described in further detail below with reference to the accompanying drawings and the specific embodiments.

Currently, the minimum thickness of circular polarizers is 60 μm or more, and the transmittance of light passing through the circular polarizers is less than 45%. Therefore, the addition of the circular polarizers to the display panel will cause a large thickness and power consumption of the display panel.

Figure 1:
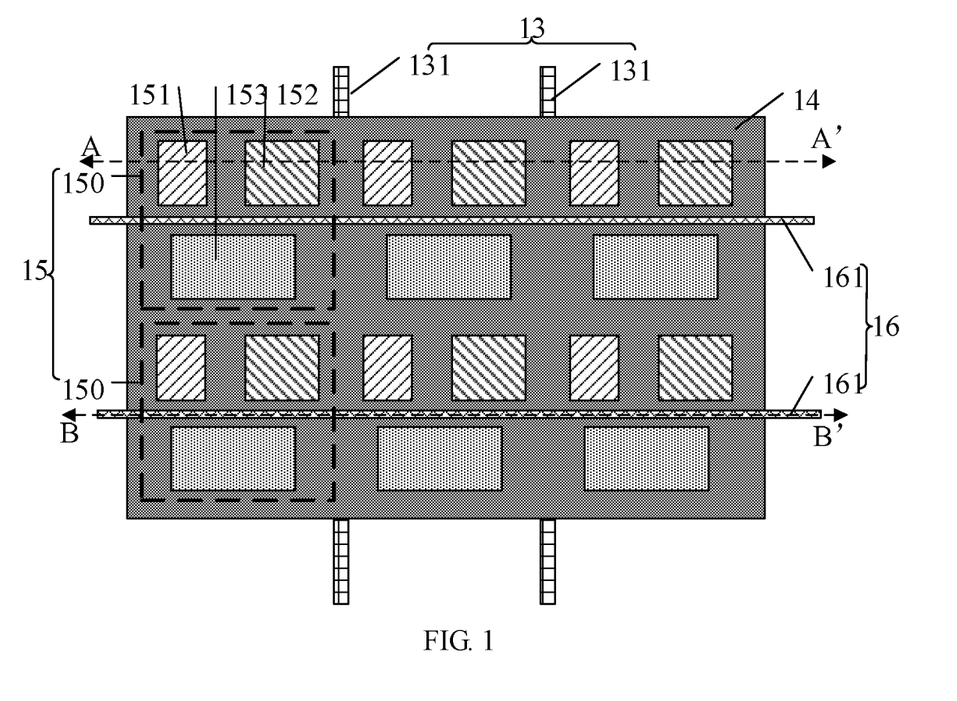
FIG. 1 is a schematic structural view of a display panel according to an embodiment of the present disclosure.
Figure 2:
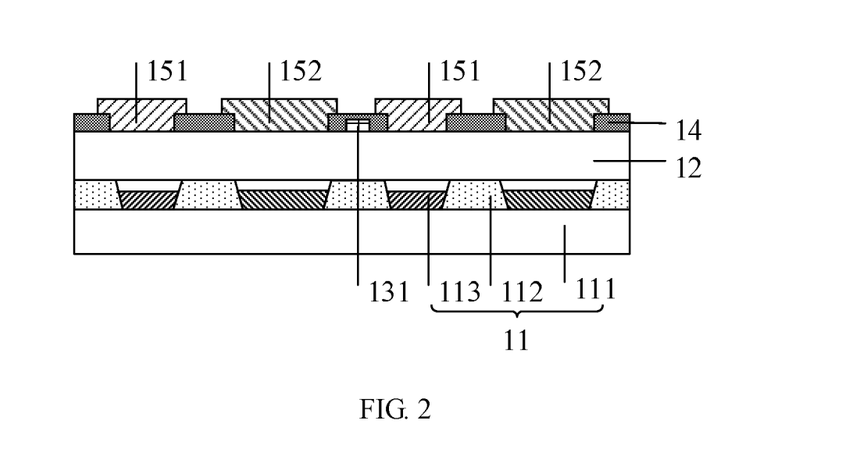
FIG. 2 is a cross-sectional view of the display panel shown in FIG. 1 along a cross section A-A'.
Figure 3:
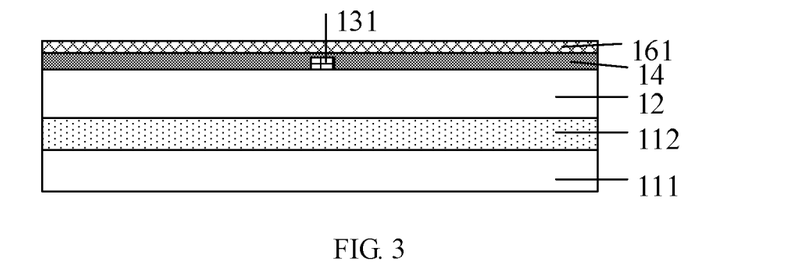
FIG. 3 is a cross-sectional view of the display panel shown in FIG. 1 along a cross section B-B'.

The embodiments of the present disclosure provide a display panel, a method for manufacturing a display panel, and a display device to solve the problem of large thickness and power consumption of the display panel due to the addition of circular polarizers to the display panel to reduce the reflectivity. Referring to FIGS. 1-3, FIG. 1 shows a schematic structural view of a display panel according to an embodiment of the present disclosure, FIG. 2 shows a cross-sectional view of the display panel shown in FIG. 1 along a cross section A-A', and FIG. 3 shows a cross-sectional view of the display panel shown in FIG. 1 along a cross section B-B'.

The display panel includes a display substrate 11, an encapsulation layer 12 covering the display substrate 11, and a first electrode layer 13 formed on the encapsulation layer 12. The display panel further includes a black matrix layer 14 and a color resist layer 15 formed on the encapsulation layer 12. The black matrix layer 14 covers the first electrode layer 13, and a second electrode layer 16 is also formed on the black matrix layer 14. One of the first electrode layer 13 and the second electrode layer 16 is a driving electrode layer, and the other is a sensing electrode layer.

Specifically, the display substrate 11 includes a base substrate 111, and a pixel defining layer 112 and an organic light emitting layer 113 formed on the base substrate 111. It should be understood that the display substrate 11 shown in FIG. 2 and FIG. 3 is represented in a simplified manner, the display substrate 11 actually includes a pixel driving circuit provided on the base substrate 111 and anodes connected to the pixel driving circuit. The organic light emitting layer 113 is disposed on a side of the anodes away from the base substrate 111. The display substrate further includes cathodes provided on a side of the organic light emitting layer away from the anodes.

The display panel further includes the encapsulation layer 12 covering the display substrate 11. The encapsulation layer 12 is actually used to cover the cathodes in the display substrate 11. The display substrate 11 is protected by the encapsulation layer 12, to prevent water and oxygen from entering the display substrate 11.

The black matrix layer 14 and the color resist layer 15 are formed on the encapsulation layer 12. An orthographic projection of the organic light emitting layer 113 in the display substrate 11 on the base substrate 111 is located within an orthographic projection of the color resist layer 15 on the base substrate 111, and an orthographic projection of the organic light emitting layer 113 in the display substrate 11 on the base substrate 111 and an orthographic projection of the black matrix layer 14 on the base substrate 111 do not overlap. The black matrix layer 14 and the color resist layer 15 are both made from low temperature cured materials.

The external light generally refers to natural light. The color resist layer 15 at one position generally allows only one color of natural light to pass through, and therefore most of the light in the natural light will be blocked by the color resist layer 15. Therefore, most of the light irradiated to the color resist layer 15 cannot enter the interior of the display panel. Further, when the external light is irradiated to the black matrix layer 14, the black matrix layer 14 can absorb the external light, thus the external light irradiated to the black matrix layer 14 cannot enter the interior of the display panel. Since the external light does not enter the interior of the display panel, it cannot be reflected inside the display panel. Therefore, the use of the black matrix layer 14 and the color resist layer 15 instead of the circular polarizer can reduce the reflectivity of the display panel. The thicknesses of the black matrix layer 14 and the color resist layer 15 are much less than the thickness of the circular polarizer, and the transmittance of the color resist layer 14 is greater than the transmittance of the circular polarizer, therefore the thickness and power consumption of the display panel can be reduced.

In addition, in order to realize the touch function of the display panel, it is necessary to form a first electrode layer 13 on the encapsulation layer 12, and allow the black matrix layer 14 to cover the first electrode layer 13, it is also necessary to form a second electrode layer 16 on the black matrix layer 14, so that the first electrode layer 13 and the second electrode layer 16 can work collaboratively. When a user touches the display panel, the touch position of the user may be detected through the first electrode layer 13 and the second electrode layer 16, thereby realizing the touch function.

One of the first electrode layer 13 and the second electrode layer 16 is a driving electrode layer, and the other is a sensing electrode layer. That is to say, if the first electrode layer 13 is a sensing electrode layer, the second electrode layer 16 is a driving electrode layer; if the first electrode layer 13 is a driving electrode layer, the second electrode layer 16 is a sensing electrode layer.

The black matrix layer 14 covers the first electrode layer 13, thus the external light cannot be irradiated onto the first electrode layer 13 through the black matrix layer 14, and the first electrode layer 13 does not reflect the external light. It is avoided that the first electrode layer is directly formed on the black matrix layer 14 so that the first electrode layer reflects the external light, which causes the reflectivity of the display panel to increase. In the embodiments of the present disclosure, the first electrode layer 13 is disposed between the encapsulation layer 12 and the black matrix layer 14, so that the black matrix layer 14 covers the first electrode layer 13, by which it prevents the first electrode layer 13 from reflecting the external light and further reduces the reflectivity of the display panel and improves the display effect.

Specifically, the color resist layer 15 includes a plurality of color resist units 150, and each of the color resist units 150 includes a plurality of color resist structures; the display substrate 11 includes a plurality of pixel units, and each pixel unit includes sub-pixels in one-to-one correspondence with the color resist structures. 3×2 pixel units are shown in FIG. 1.

As shown in FIG. 1, each color resist unit 150 includes a first color resist structure 151, a second color resist structure 152 and a third color resist structure 153, and the first color resist structure 151, the second color resist structure 152 and the third color resist structure 153 allows different colors of light to pass through.

The organic light emitting layer 113 includes a plurality of organic light emitting units arranged in an array. The organic light emitting unit, and the anode and the cathode corresponding thereto together constitute one pixel unit. The display substrate 11 includes a plurality of pixel units arranged in an array, and each pixel unit includes sub-pixels in one-to-one correspondence with the color resist structures.

For example, each color resist unit 150 includes a first color resist structure 151, a second color resist structure 152 and a third color resist structure 153, and each pixel unit includes a first sub-pixel, a second sub-pixel and a third sub-pixel. The first color resist structure 151 corresponds to the position of the first sub-pixel, the second color resist structure 152 corresponds to the position of the second sub-pixel, and the third color resist structure 153 corresponds to the position of the third sub-pixel. The light emitted from the first sub-pixel may be emitted out through the first color resist structure 151, the light emitted from the second sub-pixel may be emitted out through the second color resist structure 152, and the light emitted from the third sub-pixel may be emitted out through the third color resist structure 153.

The color of the light which can transmit through the color resist structure is the same as the color of the light emitted from the corresponding sub-pixel. In this way, on one hand, the light emitted from the sub-pixel can transmit through the color resist structure, on the other hand, the color of the natural light transmitted through the color resist structure is the same as the light emitted from the sub-pixel, therefore it does not affect the color of the light emitted from the sub-pixel.

For example, the color of the light which can transmit through the first color resist structure 151 is red, the color of the light which can transmit through the second color resist structure 152 is green, and the color of the light which can transmit through the third color resist structure 153 is blue. Then, the color of the light emitted from the first sub-pixel is red, the color of the light emitted from the second sub-pixel is green, and the color of the light emitted from the third sub-pixel is blue.

It should be understood that the number of color resist structures included in each color resist unit 150 is not limited to three, but it may be four, or any other number. Moreover, the color of the light which can transmit through the color resist structure is not limited to red, green or blue, as described above.

In some embodiments of the present disclosure, the black matrix layer 14 is located in non-pixel opening areas of the display substrate, and the color resist layer 15 partially covers the black matrix layer 14.

The display substrate 11 may be divided into pixel opening areas and non-pixel opening areas. The pixel opening areas refer to regions where the sub-pixels transmit light. The black matrix layer 14 is disposed in the non-pixel opening areas of the display substrate, therefore the normal light output of the sub-pixels is not affected. By partially covering the black matrix layer 14 with the color resist layer 15, it avoids a gap between the color resist layer 15 and the adjacent black matrix layer 14, which may result in occurrence of light leakage.

In the embodiments of the present disclosure, the first electrode layer 13 includes a plurality of first electrodes 131 provided in a first direction, the second electrode layer 16 includes a plurality of second electrodes 161 provided in a second direction, and the first direction crosses with the second direction with a preset included angle.

The first electrodes 131 may be one of the sensing electrode and the driving electrode, and the second electrodes 161 may be the other of the sensing electrode and the driving electrode. That is, if the first electrodes 131 are sensing electrodes, the second electrodes 161 are driving electrodes; if the first electrodes 131 are driving electrodes, the second electrodes 161 are sensing electrodes.

If the first electrode layer 13 is a sensing electrode layer and the second electrode layer 16 is a driving electrode layer, the first electrodes 131 are sensing electrodes and the second electrodes 161 are driving electrodes. If the first electrode layer 13 is a driving electrode layer, the second electrode layer 16 is a sensing electrode layer, the first electrodes 131 are driving electrodes and the second electrodes 161 are sensing electrodes.

A coupling capacitance is formed at the intersection of the driving electrode and the sensing electrode. By providing a detection signal to the driving electrode, the value of the coupling capacitance between the driving electrode and the sensing electrode at the touch position will change when a user touches the display panel. By receiving the signal of the sensing electrode, the position touched by the user can be determined or calculated.

As shown in FIG. 1, the first electrode 131 and the second electrode 161 are perpendicular to each other, that is, the preset included angle between the first direction and the second direction is 90°. Of course, the preset included angle may be other angles, which may be determined according to the arrangement of the pixel units in the display substrate 11.

A line width of the first electrodes 131 is less than 30 μm, a line width of the second electrodes 161 is less than 8 μm; and the first electrodes 131 and the second electrodes 161 are made from Ag.

If the line width of the first electrodes 131 may be widened, then the resistance of the first electrodes 131 will be correspondingly reduced, thereby the RC delay is reduced and the touch sensitivity of the display panel is improved. The line width of the second electrodes 161 is set to less than 8 μm, this reduces the visibility of the second electrodes 161 and makes it difficult for human eyes to directly observe the second electrodes 161.

In some other embodiments of the present disclosure, one or more color resist structures in the color resist unit 150 partially cover the second electrode layer 16.

Figure 4:
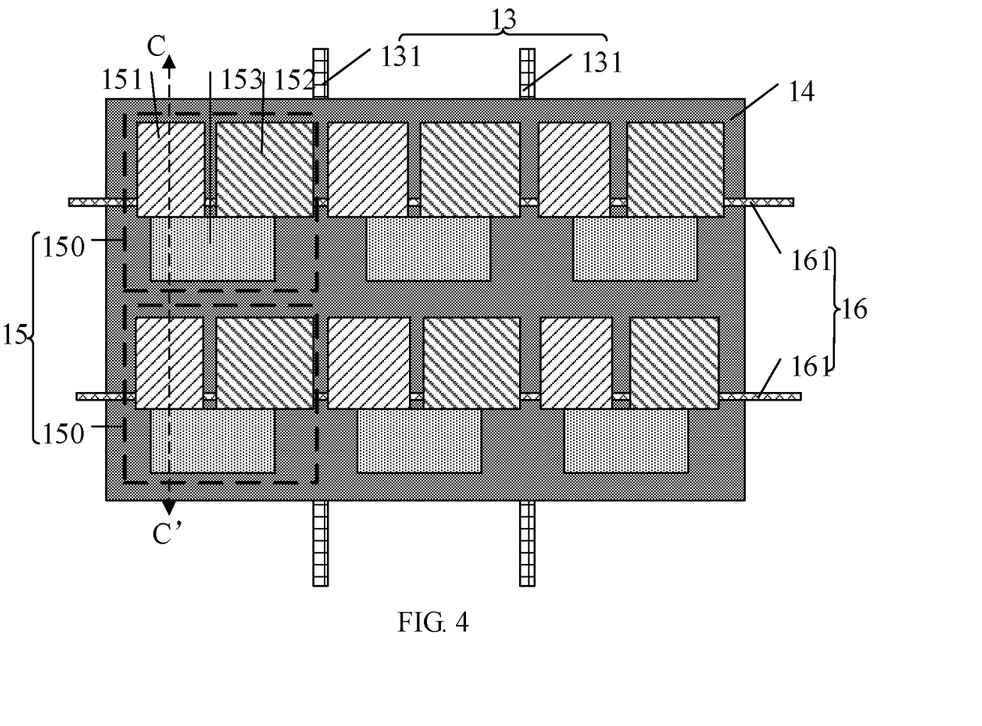
FIG. 4 is a schematic structural view of a display panel according to an embodiment of the present disclosure.

As shown in FIG. 4, each color resist unit 150 includes a first color resist structure 151, a second color resist structure 152 and a third color resist structure 153. By increasing the sizes of the first color resist structure 151 and the second color resist structure 152 in the color resist unit 150 but keeping the size of the third color resist structure 153 unchanged, the first color resist structure 151 and the second color resist structure 152 may partially cover the second electrode layer 16, then the external light is first irradiated onto the first color resist structure 151 and the second color resist structure 152, the first color resist structure 151 and the second color resist structure 152 filter most of the external light, and only a small amount of external light is irradiated onto the second electrode layer 16. In this way, the reflection of external light by the second electrode layer 16 is reduced, and the reflectivity of the display panel is further reduced.

Figure 5:
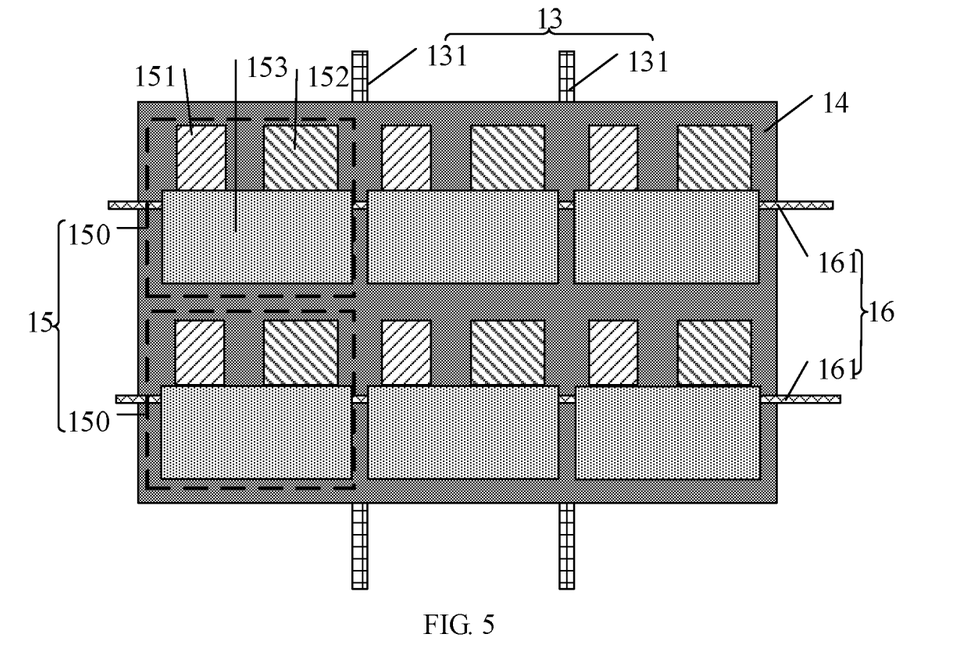
FIG. 5 is a schematic structural view of a display panel according to an embodiment of the present disclosure.

As shown in FIG. 5, by increasing the size of the third color resist structure 153 in the color resist unit 150 but keeping the sizes of the first color resist structure 151 and the second color resist structure 152 unchanged, the third color resist structure 153 may partially cover the second electrode layer 16, then the external light is first irradiated onto the third color resist structure 153, the third color resist structure 153 filters most of the external light, and only a small amount of external light is irradiated onto the second electrode layer 16. In this way, the reflection of external light by the second electrode layer 16 is reduced, and the reflectivity of the display panel is further reduced. It should be noted that, in the display panels shown in FIG. 4 and FIG. 5, there is a gap between two color resist structures in each color resist unit 150 or they are in contact with each other, but there is no overlapping area therebetween. Therefore, there is a small part of the second electrode layer 16 in the display panel which is not covered by the color resist structures, but most of the second electrode layer 16 is covered by one or more color resist structures in the color resist unit 150. A small part of the second electrode layer 16 which is not covered by the color resist structures has a little effect on the reflectivity of the display panel.

Figure 6:
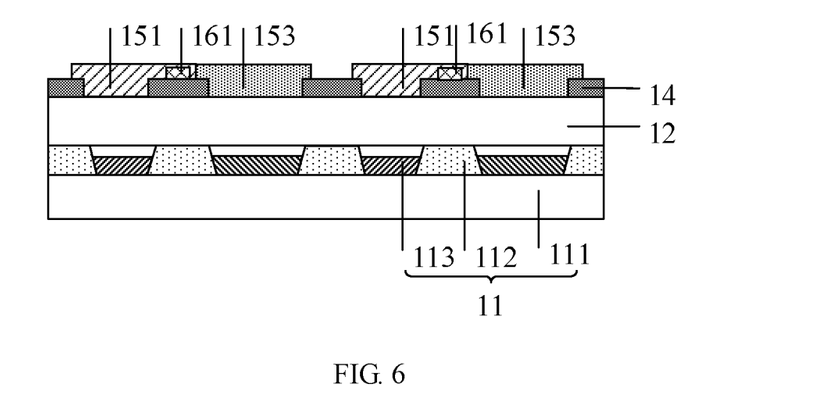
FIG. 6 is a cross-sectional view of the display panel shown in FIG. 4 along a cross section C-C'.

As shown in FIG. 6, the first color resist structure 151 and the third color resist structure 153 are in contact with each other, but there is no overlapping area therebetween, and the first color resist structure 151 partially covers the second electrode layer 16.

In some other embodiments of the present disclosure, orthographic projections of two adjacent color resist structures in the color resist unit 150 on the encapsulation layer 12 have an overlapping area, the color resist structures cover the second electrode layer 16 at the overlapping area, and the color resist structures do not cover the pixel opening areas of the sub-pixels in the display substrate at the overlapping area.

Figure 7:
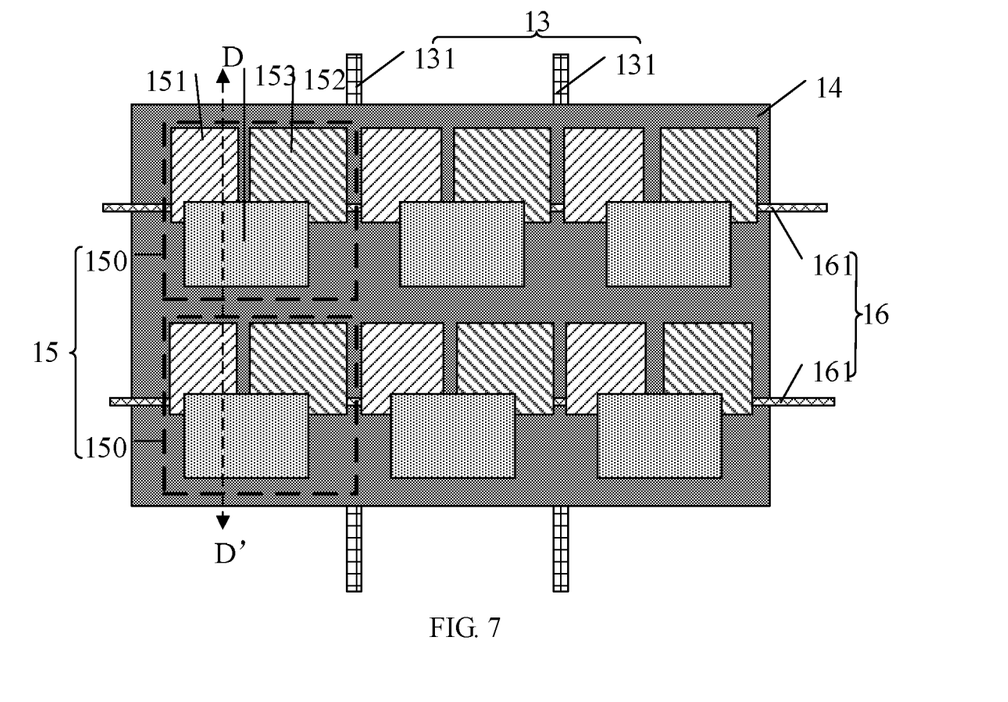
FIG. 7 is a schematic structural view of a display panel according to an embodiment of the present disclosure.

As shown in FIG. 7, each color resist unit 150 includes a first color resist structure 151, a second color resist structure 152 and a third color resist structure 153. By increasing the size of the first color resist structure 151, the second color resist structure 152 and the third color resist structure 153 in the color resist unit 150, two adjacent color resist structures in the color resist unit 150 may be made to have an overlapping area, i.e., the first color resist structure 151 and the third color resist structure 153 adjacent to each other have an overlapping area, the second color resist structure 152 and the third color resist structure 153 adjacent to each other have an overlapping area, that is to say, orthographic projections of two adjacent color resist structures in the color resist unit 150 on the encapsulation layer 12 have overlapping areas.

By setting the color resist structures to cover the second electrode layer 16 at the overlapping area, the external light needs to pass through two layers of color resist structure to be irradiated onto the second electrode layer 16. Since very little light can transmit through two layers of color resist structure, there is only a very small amount of external light that may be irradiated onto the second electrode layer 16 after the external light passes through the two layers of color resist structure. The external light passing through the two layers of color resist structure is basically negligible, therefore the reflectivity of the display panel is further reduced.

By setting the color resist structures not to cover the pixel opening area of the sub-pixels in the display substrate at the overlapping area, the light emitted from the sub-pixel may be normally emitted through the color resist structures without affecting the display of the display panel.

Figure 8:
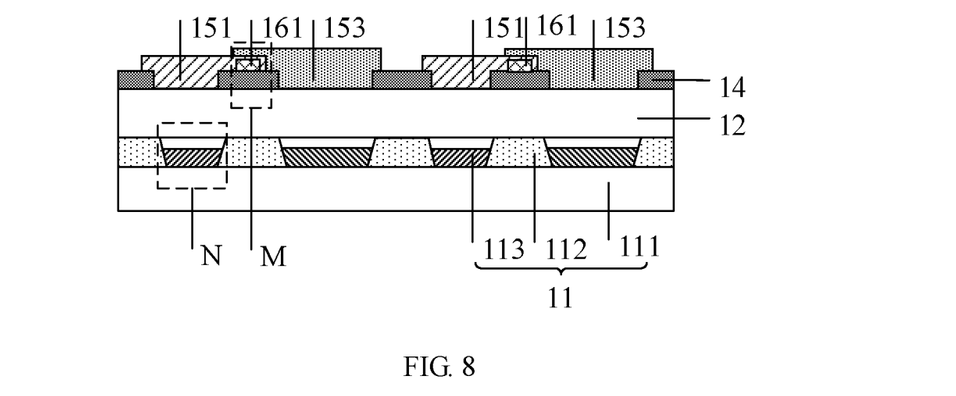
FIG. 8 is a cross-sectional view of the display panel shown in FIG. 7 along a cross section D-D'.

As shown in FIG. 8, the overlapping area of the adjacent first and third color resist structures 151 and 153 is M, and the color resist structures cover the second electrode layer 16 at the overlapping area M. The pixel opening area of the sub-pixel is N, it can be seen that the color resist structures do not cover the pixel opening area N of the sub-pixel in the display substrate at the overlapping area M.

Figure 9:
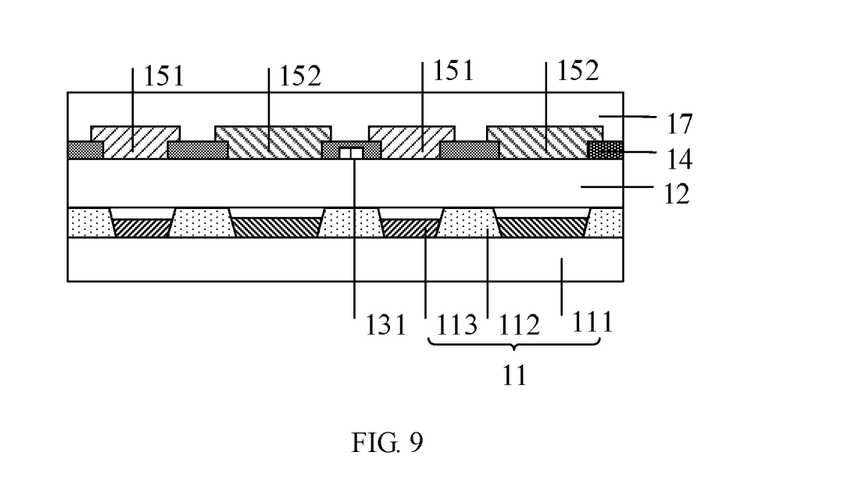
FIG. 9 is a cross-sectional view of a display panel according to an embodiment of the present disclosure.

As shown in FIG. 9, the display panel further includes a planarization layer 17 that covers the black matrix layer 14, the color resist layer 15 and the second electrode layer 16.

By forming a planarization layer 17 that covers the black matrix layer 14, the color resist layer 15 and the second electrode layer 16, the flatness of the display panel is improved.

FIG. 9 shows the formation of a planarization layer 17 on the structure shown in FIG. 2. It should be understood that a planarization layer 17 may also be formed on the structures shown in FIGS. 1 to 8, and the planarization layer 17 covers the black matrix layer 14, the color resist layer 15 and the second electrode layer 16.

In the embodiments of the present disclosure, a display substrate, an encapsulation layer covering the display substrate, and a first electrode layer formed on the encapsulation layer are provided in the display panel, the display panel further includes a black matrix layer and a color resist layer formed on the encapsulation layer, the black matrix layer covers the first electrode layer, and a second electrode layer is further formed on the black matrix layer. The use of the black matrix layer and the color resist layer instead of the circular polarizer can reduce the reflectivity of the display panel. The thicknesses of the black matrix layer and the color resist layer are much less than the thickness of the circular polarizer, and the transmittance of the color resist layer is greater than the transmittance of the circular polarizer, therefore the thickness and power consumption of the display panel can be reduced. In addition, by covering the first electrode layer with the black matrix layer, the external light cannot be irradiated onto the first electrode layer through the black matrix layer, and the first electrode layer does not reflect the external light, which further reduces the reflectivity of the display panel and improves the display effect.

Further, by partially covering the second electrode layer with the color resist units, the external light is first irradiated onto the color resist unit, the color resist units filter most of the external light, and only a small amount of external light is irradiated onto the second electrode layer, which reduces the reflection of external light by the second electrode layer and further reduces the reflectivity of the display panel.

If different color resist structures included in the color resist unit are overlapped and the color resist structures cover the second electrode layer at the overlapping area, then the external light needs to pass through two layers of color resist structure to be irradiated onto the second electrode layer. Since very little light can transmit through multiple layers of color resist structure, there is only a very small amount of external light that may be irradiated onto the second electrode layer 16 after the external light passes through the multiple layers of color resist structure. In this way, the reflectivity of the display panel is further reduced.

Figure 10:
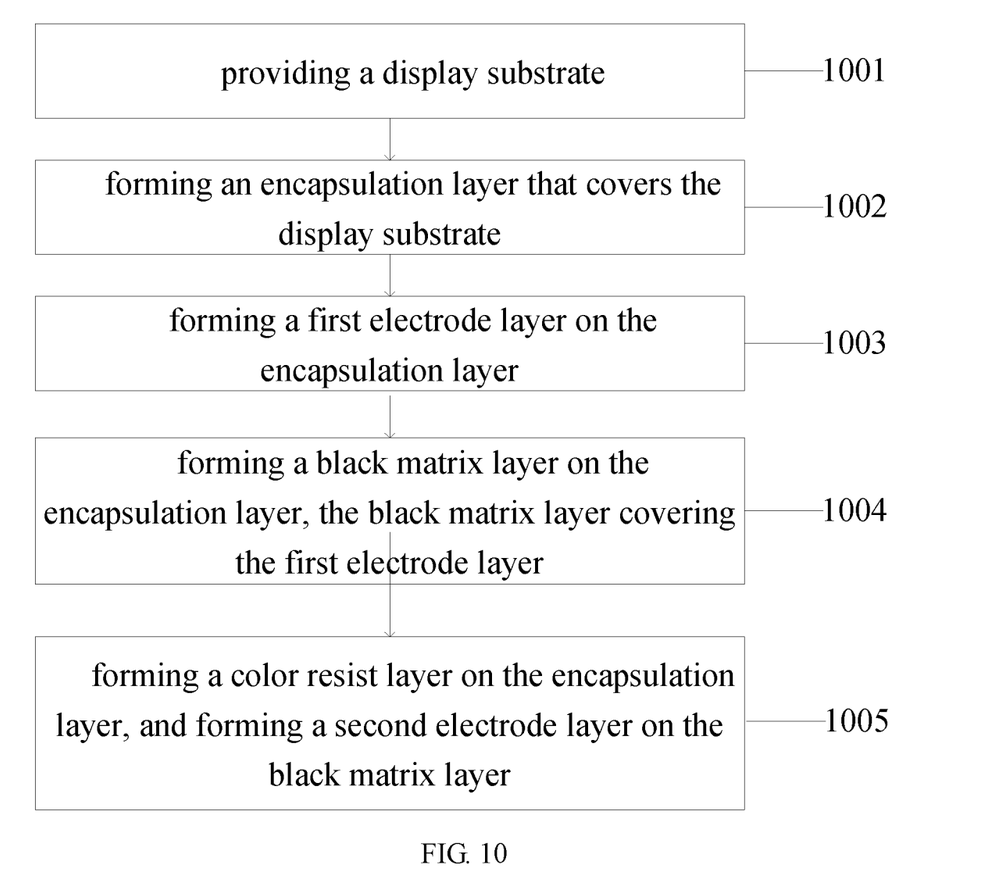
FIG. 10 is a flowchart of a method for manufacturing a display panel according to an embodiment of the present disclosure.

Referring to FIG. 10, a flowchart of a method for manufacturing a display panel according to an embodiment of the present disclosure is shown. The method for manufacturing the display panel may specifically include the following steps:

Step 1001: providing a display substrate.

In the embodiments of the present disclosure, when manufacturing a display panel, a display substrate 11 needs to be provided first. As shown in FIGS. 2 and 3, the display substrate 11 includes a base substrate 111, and a pixel driving circuit is formed on the base substrate 11. Next, anodes connected to the pixel driving circuit are formed on the pixel driving circuit, and then a pixel defining layer 112 is formed on the pixel driving circuit. An organic light emitting layer 113 is formed at regions defined by the pixel defining layer 112 through a printing process or an evaporation process. Finally, cathodes are formed, and the display substrate 11 is obtained.

Step 1002: forming an encapsulation layer that covers the display substrate.

In the embodiments of the present disclosure, after the display substrate 11 is manufactured, an encapsulation layer 12 covering the display substrate 11 is formed. The encapsulation layer 12 may be a thin film encapsulation layer.

Step 1003: forming a first electrode layer on the encapsulation layer.

In the embodiments of the present disclosure, a first electrode layer 13 is formed on the encapsulation layer 12. The first electrode layer 13 includes a plurality of first electrodes 131 provided in the first direction. Specifically, silver halide solution may be coated on the encapsulation layer 12, the silver halide solution is dried to obtain a metal layer. Then, a photoresist is coated on the metal layer, and the photoresist coated on the metal layer is exposed by using a mask. After exposing, a developing process is implemented, and the photoresist in some areas is removed. The metal layer at the photoresist removal area is etched by an etching process to obtain the first electrode layer 13. Finally, the remaining photoresist is removed.

Step 1004: forming a black matrix layer on the encapsulation layer, the black matrix layer covering the first electrode layer.

In the embodiments of the present disclosure, a black matrix layer material is coated on the encapsulation layer 12, and the black matrix layer 14 is formed by processes such as exposure and development, so that the black matrix layer 14 covers the first electrode layer 13.

Step 1005: forming a color resist layer on the encapsulation layer, and forming a second electrode layer on the black matrix layer.

In the embodiments of the present disclosure, after the black matrix layer 14 is formed on the encapsulation layer 12, a color resist layer material is coated on the encapsulation layer 12, and the color resist layer 15 is formed by processes such as exposure and development. A silver halide solution is coated on the black matrix layer 14, after implementing a dry process, a photoresist is applied, and then a second electrode layer 16 is obtained after exposure, development, and etching. The second electrode layer 16 includes a plurality of second electrodes 161 provided in the second direction. Finally, the remaining photoresist is removed.

It should be noted that, if the color resist layer 14 does not cover the second electrode layer 16, that is, the display panel shown in FIG. 1 is formed, the order of forming the color resist layer 15 on the encapsulation layer 12 and forming the second electrode layer 16 on the black matrix layer 14 may be reversed, that is, it is possible to form the color resist layer 15 on the encapsulation layer 12 first, and then form the second electrode layer 16 on the black matrix layer 14, alternatively, it is also possible to form the second electrode layer 16 on the black matrix layer 14 first, and then form the color resist layer 15 on the encapsulation layer 12.

If the color resist layer 14 needs to cover the second electrode layer 16, that is, the display panels shown in FIGS. 4 to 8 are formed, it is necessary to form the second electrode layer 16 on the black matrix layer 14 first, and then form the color resist layer 15 on the encapsulation layer 12.

In order to form the display panels shown in FIGS. 4 to 8, the size of the color resist structures in the color resist layer 15 needs to be increased during the manufacturing process to further reduce the reflectivity of the display panel.

One of the first electrode layer 13 and the second electrode layer 16 is a driving electrode layer, and the other is a sensing electrode layer.

In some embodiments of the present disclosure, after step 1005, the method further includes:

forming a planarization layer, the planarization layer covering the black matrix layer, the color resist layer, and the second electrode layer.

As shown in FIG. 9, after forming the color resist layer 15 on the encapsulation layer 12 and forming the second electrode layer 16 on the black matrix layer 14, a planarization layer 17 that covers the black matrix layer 14, the color resist layer 15 and the second electrode layer 16 is formed.

In the embodiments of the present disclosure, by providing a display substrate, forming an encapsulation layer that covers the display substrate, forming a first electrode layer on the encapsulation layer, forming a black matrix layer that covers the first electrode layer on the encapsulation layer, forming a color resist layer on the encapsulation layer, and forming a second electrode layer on the black matrix layer, a display panel is obtained. The use of the black matrix layer and the color resist layer instead of the circular polarizer can reduce the reflectivity of the display panel. The thicknesses of the black matrix layer and the color resist layer are much less than the thickness of the circular polarizer, and the transmittance of the color resist layer is greater than the transmittance of the circular polarizer, therefore the thickness and power consumption of the display panel can be reduced. In addition, by covering the first electrode layer with the black matrix layer, the external light cannot be irradiated onto the first electrode layer through the black matrix layer, and the first electrode layer does not reflect the external light, which further reduces the reflectivity of the display panel and improves the display effect.

In an embodiment of the present disclosure, it further provides a display device including the above display panel.

The display device is an OLED display device that can be applied to any display device with display and touch functions, such as a mobile phone, a tablet computer, a television, a display, a notebook computer, a navigator, and the like.

In addition, for the specific description of the display device, reference may be made to the description of the display panel and the method for manufacturing the display panel, therefore it will not be repeatedly described in the present disclosure.

In the embodiments of the present disclosure, a display substrate, an encapsulation layer covering the display substrate, and a first electrode layer formed on the encapsulation layer are provided in the display panel, the display panel further includes a black matrix layer and a color resist layer formed on the encapsulation layer, the black matrix layer covers the first electrode layer, and a second electrode layer is further formed on the black matrix layer. The use of the black matrix layer and the color resist layer instead of the circular polarizer can reduce the reflectivity of the display panel. The thicknesses of the black matrix layer and the color resist layer are much less than the thickness of the circular polarizer, and the transmittance of the color resist layer is greater than the transmittance of the circular polarizer, therefore the thickness and power consumption of the display panel can be reduced. In addition, by covering the first electrode layer with the black matrix layer, the external light cannot be irradiated onto the first electrode layer through the black matrix layer, and the first electrode layer does not reflect the external light, which further reduces the reflectivity of the display panel and improves the display effect.

In the embodiments of the present disclosure, the wirings of driving electrodes and sensing electrodes are manufactured on the upper and lower sides of the black matrix layer, which can effectively reduce the visibility and reflection of the metal wires, reduce the RC delay phenomenon, and improve the touch sensitivity. The color resist unit blocks the entry of external light, blocks the external light from irradiating the metal wires on the outside of the black matrix layer, which further reduces the reflection of the metal wiring. Based on the reduction of visibility and reflection of metal wiring, the width of the wiring may be appropriately widened, thereby reducing wire resistance and achieving high sensitivity touch.

For the foregoing embodiments referred to the method, in order to simplify the description, they are all described as a combination of a series of actions, but it should be appreciated by those skilled in the art that the present disclosure is not limited by the order of the actions described, because according to the present disclosure, some certain steps may be performed in other orders or simultaneously. Secondly, it should be appreciated by those skilled in the art that the embodiments described in the specification of the present disclosure are all optional embodiments, and the actions and modules involved are not necessarily required by the present disclosure.

Each embodiment in the specification is described in a progressive manner Each embodiment focuses on the differences from other embodiments, and the part in one embodiment may refer to the same or similar part in other embodiments.

Finally, it should be noted that in this specification, relational terms such as "first" and "second" are used only to distinguish one entity or operation from another entity or operation, but do not necessarily require or imply these entities or operations have any such actual relationship or order therebetween. Moreover, the terms "include", "comprises" or any other variations thereof are intended to mean non-exclusive inclusion, such that a process, method, good or equipment that includes a series of elements includes not only those elements but also other elements that are not explicitly listed, or further includes those elements that are inherent to such a process, method, good or equipment. Without more restrictions, the element defined by the sentence "include a" does not exclude that the process, method, good or equipment including such an element further includes other identical elements.

The display panel, the method for manufacturing the display panel, and the display device provided by the present disclosure have been described in detail above. The specific examples are used herein to explain the principle and implementation of the present disclosure. The description of the above embodiments is only for intended for the understanding of the methods and core ideas of the present disclosure. At the same time, changes may be made by those skilled in the art in terms of specific implementation and scope of application according to the ideas of the present disclosure. In summary, the specification should not be interpreted as limiting the present disclosure.

What is claimed is:

1. A display panel, comprising:
a display substrate;
an encapsulation layer covering the display substrate;
a plurality of first electrodes on the encapsulation layer;
a black matrix disposed on the encapsulation layer and covering the plurality of first electrodes;
a plurality of color resist units disposed on the encapsulation layer and located in opening areas of the black matrix; and
a plurality of second electrodes on the black matrix,
wherein each of the color resist units comprises a plurality of color resist structures, the display substrate comprises a plurality of pixel units, and each of the pixel units comprises sub-pixels in one-to-one correspondence with the color resist structures,
wherein one or more of the color resist structures in each of the color resist units partially cover the second electrodes,
wherein orthographic projections of two adjacent color resist structures in each of the color resist units on the encapsulation layer have an overlapping area;
wherein the color resist structures cover the second electrodes at the overlapping area, and the color resist structures do not cover pixel opening areas of the sub-pixels in the display substrate at the overlapping area.

2. The display panel according to claim 1, wherein a color of light allowed to be transmitted through by one color resist structure is same as a color of light emitted by the sub-pixel corresponding to the color resist structure.

3. The display panel according to claim 1, wherein each of the color resist units partially covers the black matrix.

4. The display panel according to claim 1, wherein the first electrodes are disposed in a first direction, the second electrodes are disposed in a second direction, and the first direction crosses with the second direction with a preset included angle.

5. The display panel according to claim 1, wherein a line width of the first electrodes is less than 30 μm, and a line width of the second electrodes is less than 8 μm.

6. The display panel according to claim 1, wherein the first electrodes and the second electrodes are made from Ag.

7. The display panel according to claim 1, wherein the display panel further comprises a planarization layer covering the black matrix, the color resist units, and the second electrodes.

8. The display panel according to claim 1, wherein one type of the plurality of first electrodes and the plurality of second electrodes functions as driving electrodes, and the other type of the plurality of first electrodes and the plurality of second electrodes functions as sensing electrodes.

9. The display panel according to claim 1, wherein the display substrate comprises a base substrate, a pixel defining layer on the base substrate, and an organic light emitting layer in opening areas of the pixel defining layer.

10. The display panel according to claim 9, wherein an orthographic projection of the organic light emitting layer in the display substrate on the base substrate is located within an orthographic projection of the color resist units on the base substrate, and the orthographic projection of the organic light emitting layer in the display substrate on the base substrate does not overlap with an orthographic projection of the black matrix on the base substrate.

11. A display device, comprising the display panel according to claim 1.

12. A method for manufacturing a display panel, comprising:
providing a display substrate;
forming an encapsulation layer on the display substrate, the encapsulation layer covering the display substrate;
forming a plurality of first electrodes on the encapsulation layer;
forming a black matrix on the encapsulation layer, the black matrix covering the plurality of first electrodes; and
forming a plurality of color resist units on the encapsulation layer and forming a plurality of second electrodes on the black matrix, the plurality of color resist units being located in open areas of the black matrix,
wherein each of the color resist units comprises a plurality of color resist structures, the display substrate comprises a plurality of pixel units, and each of the pixel units comprises sub-pixels in one-to-one correspondence with the color resist structures,
wherein one or more of the color resist structures in each of the color resist units partially cover the second electrodes,
wherein orthographic projections of two adjacent color resist structures in each of the color resist units on the encapsulation layer have an overlapping area;
wherein the color resist structures cover the second electrodes at the overlapping area, and the color resist structures do not cover pixel opening areas the sub-pixels in the display substrate at the overlapping area.

13. The method according to claim 12, wherein forming a plurality of color resist units on the encapsulation layer and forming a plurality of second electrodes on the black matrix comprises:
forming the plurality of color resist units on the encapsulation layer; and
forming the plurality of second electrodes on the black matrix.

14. The method according to claim 12, wherein forming a plurality of color resist units on the encapsulation layer and forming a plurality of second electrodes on the black matrix comprises:
forming the plurality of second electrodes on the black matrix; and
forming the plurality of color resist units on the encapsulation layer.

15. The method according to claim 14, wherein the color resist units partially cover the second electrodes.

16. The method according to claim 12, wherein after forming a plurality of color resist units on the encapsulation layer and forming a plurality of second electrodes on the black matrix, the method further comprises:
forming a planarization layer, the planarization layer covering the black matrix, the color resist units, and the second electrodes.

* * * * *